United States Patent [19]

Burt

[11] Patent Number: 5,091,657
[45] Date of Patent: Feb. 25, 1992

[54] HIGH SPEED MULTIPLEX SWITCH CIRCUIT AND METHOD

[75] Inventor: Rodney T. Burt, Tucson, Ariz.

[73] Assignee: Burr-Brown Corporation, Tucson, Ariz.

[21] Appl. No.: 671,342

[22] Filed: Mar. 19, 1991

[51] Int. Cl.$^5$ .......................................... H03K 17/00
[52] U.S. Cl. .................................. 307/246; 307/571; 307/572
[58] Field of Search ............... 307/239, 240, 246, 571, 307/572

[56] References Cited

U.S. PATENT DOCUMENTS 4,042,836  8/1977  Compton et al. ............... 307/251
4,228,367  10/1980  Brown ............................ 307/251

*Primary Examiner*—Robert J. Pascal
*Attorney, Agent, or Firm*—Cahill, Sutton & Thomas

[57] ABSTRACT

A high speed, high current analog switching circuit includes a switch JFET having its drain electrode connected to an analog input voltage terminal and a source electrode connected to an analog output voltage terminal. The gate electrode of the JFET switch is connected to switching control circuitry. The analog switching circuit includes circuitry that prevents the source-gate PN junction of the switch JFET from ever being forward biased more than approximately 0.2 volts. This prevents the charge storage capacitance of that PN junction from ever increasing to such high values (e.g. 100 to 1000 picofarads) that discharging of the charge storage capacitance through the channel resistance of the switch JFET takes excessively long periods of time. Rapid equalization of the analog output voltage and analog input voltage to within approximately 10 microvolts of each other is thereby achieved.

15 Claims, 2 Drawing Sheets

HIGH SPEED MULTIPLEX SWITCH CIRCUIT AND METHOD

BACKGROUND OF THE INVENTION

The invention relates to high current analog switches, and more particularly to integrated circuit analog switches the node voltages of which rapidly settle to within a few microvolts of their quiescent values.

The state of the art for high speed integrated circuit analog switches is generally indicated in U.S. Pat. Nos. 4,042,836 (Compton et al.) and 4,228,367 (Brown). Junction field effect transistors (JFETs) are widely used in integrated circuit analog switches. When high currents must be switched, relatively large JFETs must be utilized as the analog switching elements. Such large JFETs have large gate capacitances which are difficult to charge and discharge with sufficient speed to satisfy the requirements of certain high speed switching applications. The above patents disclose circuits which result in fast turn-on and turn-off of high current analog JFET switches despite their high gate capacitances. However, if the circuits disclosed in the above references are connected to analog busses with large capacitances, e.g. 100 to 1,000 picofarads, such circuits require very long times, e.g., ten to thirty microseconds, for their output voltages to settle to within a few microvolts of their analog input voltages.

There is an unmet need for a high speed, high current integrated circuit analog switch that produces fast turn-on and fast turn-off of the JFET switching elements and also provides rapid equalization of the analog input and output voltages to within a few microvolts while driving large capacitive loads.

There also is a need to maintain conservation of charge between the analog input and analog output terminals of analog switches when used in certain applications. For example, in a so-called "flying capacitor" circuit in which a capacitor is first charged through an analog switch from an input source, then disconnected from the input source, and the stored charge then is redistributed through a second analog switch to a second capacitor, and the voltage on the second capacitor then is sampled by a suitable circuit, it is essential that there be no parasitic current leakage associated with the second analog switch if the sensed voltage is to accurately represent the sampled input voltage.

SUMMARY OF THE INVENTION

Accordingly, it is an object of the invention to provide an improved high speed, high current analog JFET switch circuit that produces fast turn-on and turn-off times and also provides fast settling or equalization of the analog input and output voltages to within a few microvolts of their quiescent values.

Another object of the invention is to provide an improved high speed, high current analog JFET switch circuit with input and output analog terminals which are functionally completely interchangeable.

Another object of the invention is to provide an improved high speed, high current analog JFET switch circuit which accurately maintains charge conservation between an analog input terminal and an analog output terminal.

Briefly described, and in accordance with one embodiment thereof, a high speed, high current analog switching circuit including a switch JFET with a first current-carrying electrode connected to an analog input terminal, and a second current-carrying electrode connected to an analog output terminal. A first JFET (22) has a drain electrode connected to a negative supply voltage and a gate electrode connected to the first current-carrying electrode of the switch JFET. A second JFET (24) has a first current-carrying electrode connected to the source electrode of the first JFET, a second current-carrying electrode connected to the gate electrode of the switch JFET, and a gate electrode connected to the gate electrode of the switch JFET. A third JFET (29) has a drain electrode connected to the negative supply voltage conductor, and a gate electrode connected to the second current-carrying electrode of the switch JFET. A fourth JFET has a first current-carrying electrode connected to the source electrode of the third JFET, a second current-carrying electrode connected to the gate electrode of the JFET switch, and a gate electrode connected to the gate electrode of the switch JFET. A bias JFET having a source electrode and a gate electrode connected to a positive supply voltage conductor and a drain electrode connected to the gate electrode of the switch JFET is provided for the purpose of minimizing the source-gate voltage of the switching JFET. Both rapid turn-on of the switch JFET and rapid equalization of voltages on the analog input terminal and the analog output terminal to below about 10 microvolts are achieved by the circuit.

In the described embodiment, the switch JFET has a large (100X) channel width-to-length ratio, the first and third JFETs have a substantially smaller (10X) channel width-to-length ratio, and the second and fourth JFETs have the smaller (5X) channel width-to-length ratios. Pull-up JFETs with source and gate electrodes connected to the positive supply have their drain electrodes coupled to the source electrodes of the first JFET and the third JFET, respectively. A control circuit having a sample control input signal produces an output connected to the gate electrode of the switch JFET. The control circuit includes a bipolar transistor with its base electrode connected to a current source responsive to the sample control input signal and an emitter electrode connected to the gate of the switch JFET. A resistor coupled between the base and the emitter electrodes of the bipolar transistor develops a large enough base-emitter voltage to turn the bipolar transistor on when the current source is turned on in response to the switch control input. Rapid turn-off of the switch JFET is thereby achieved in response to one level of the switch control input signal. A high impedance condition is achieved in response to another level of the switch control input signal. The described circuit prevents the source-gate PN junction of the switch JFET from every being sufficiently forward biased to produce very large charge storage capacitances which must be discharged through the channel resistance of the switch JFET, and thereby prevents small (e.g., 10 microvolt) errors from taking a very long time to settle out.

DETAILED DESCRIPTION OF THE PREFERRED EMBODIMENT

Figure 1:
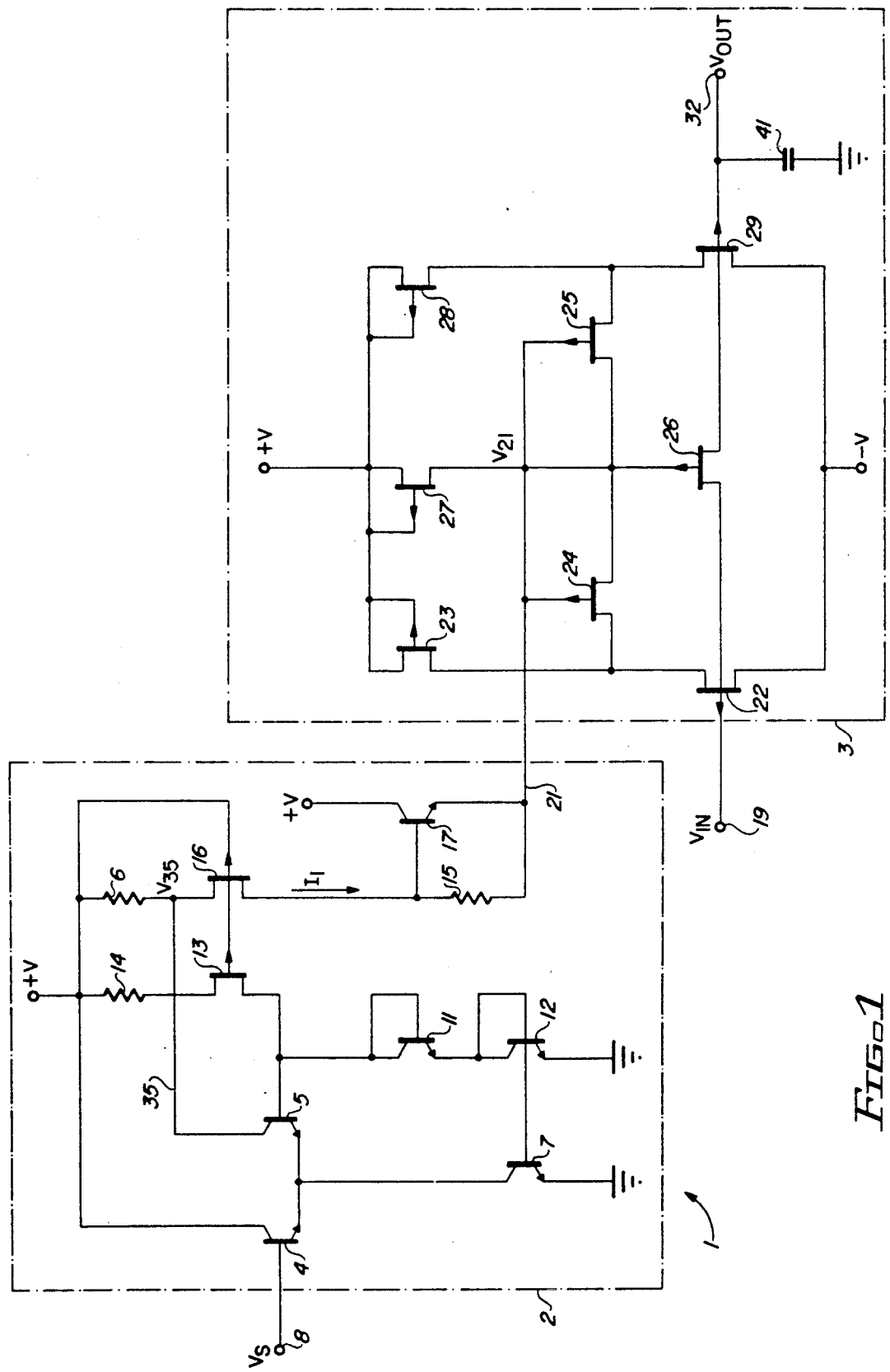
FIG. 1 is a schematic diagram of a preferred embodiment of the invention.

Referring to FIG. 1, analog switch circuit 1, which preferably is implemented as a monolithic integrated circuit, includes an input circuit 2 which receives a sample voltage $v_s$ on conductor 8 and produces a voltage $V_{21}$ on conductor 21. Conductor 21 is connected to an input of switching circuit 3.

Input circuit 2 includes an NPN transistor 4 having its base connected to control conductor 8, its collector connected to $+V$, and its emitter connected to the emitter of NPN transistor 5 and the collector of NPN transistor 7. When $V_s$ is at a high level, P-channel JFET 26 in switching circuit 3 is turned off. When $V_s$ is at a low level, JFET 26 is turned on.

Transistor 7 is a current mirror output transistor having its emitter connected to ground and its base connected to the base of NPN current mirror control transistor 12. The emitter of transistor 12 is connected to ground, and its collector is connected to its base and also to the emitter of NPN diode-connected transistor 11. The base and collector of transistor 11 are connected to the base of transistor 5 and to the drain of P channel JFET 13.

The collector of NPN transistor 5 is connected by conductor 35 to one terminal of pullup resistor 6, the other terminal of which is connected to $+V$. The voltage on conductor 35 is designated $V_{35}$. Conductor 35 also is connected to the source electrode of P channel JFET 16, the gate electrode of which is connected to the gate electrode of JFET 13 and also to $+V$ (or other suitable bias voltage). The source electrode of JFET 13 is connected to one terminal of pullup resistor 14, the other terminal of which is connected to $+V$.

The drain of JFET 16 is connected to the base of NPN transistor 17 and one terminal of resistor 15. The other terminal of resistor 15 is connected by conductor 21 to the emitter of transistor 17, the collector of which is connected to $+V$. The voltage on conductor 21 is designated $V_{21}$. A current $I_1$ flows through the drain electrode of JFET 16. Exemplary values of resistors 6, 14, and 15 are 5 kilohms, 5 kilohms, and 10 kilohms, respectively. Resistor 14, JFET 13, and diode 11 form a bias current circuit which supplies a suitable bias current to transistor 12 to control the current in current mirror output transistor 7.

Switching circuit 3 includes above mentioned switching JFET 26, which has a large (100X) channel width-to-length ratio. Its gate electrode is connected to conductor 21. JFET 26 has two current-carrying electrodes, one functioning as a source electrode and the other has a drain electrode. (All of the JFETs shown in FIG. 1 ar P channel JFETs.)

Figure 1A:
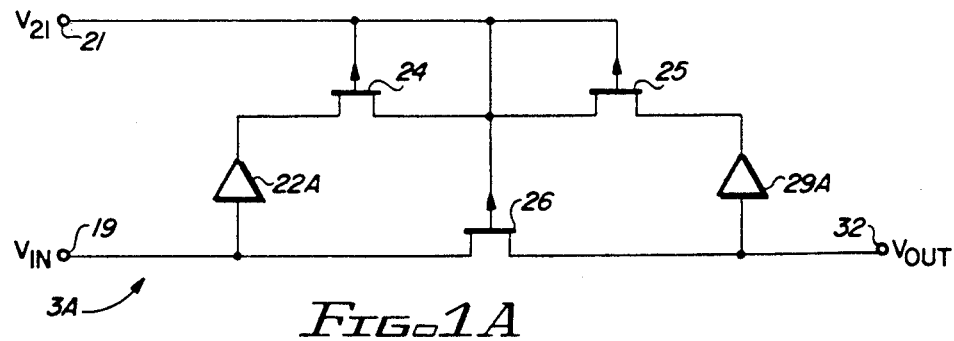
FIG. 1A is a schematic diagram of a generalized embodiment of the invention.

The left hand current-carrying electrode of JFET 26 is connected to the gate of JFET 22, which has a channel width-to-length ratio equal to about one tenth that of JFET 26. (As with any P-channel junction field effect transistor, the current carrying electrode at the highest voltage acts as the source electrode and the other current-carrying electrode acts as the drain electrode.) The current-carrying electrode that is the gate electrode of JFET 22 also is connected to analog input voltage conductor 19. The analog input voltage $V_{in}$ is applied to conductor 19. The drain of JFET 22 is connected to $-V$. The source of JFET 22 is connected to one of the current-carrying electrodes of JFET 24, the other current-carrying electrode of JFET 24 being connected to conductor 21. The gate electrode of JFET 24 is connected to conductor 21. The right hand current-carrying electrode of JFET 26 is connected to the gate electrode of JFET 29 and to output conductor 32, on which the analog output voltage $V_{out}$ is produced. It should be noted that JFETs 22 and 23 function as a buffer circuit, and JFETs 29 and 28 also function as a buffer circuit. These buffer circuits are more generally indicated by reference numerals 22A and 29A, respectively, in the generalized embodiment of switching circuit 3A shown in FIG. 1A.

The drain of JFET 29 is connected to $-V$, and its source is connected to one current-carrying electrode of JFET 25, the other current-carrying electrode of which is connected to conductor 21. The gate electrode of JFET 25 is connected to conductor 21. JFET 29 has the same channel width-to-length ratio (10X) as JFET 22. (The term "X" refers to a "minimum geometry" JFET, in which the channel width is equal to the channel length.) JFETs 24 and 25 each have a channel width-to-length ratio of 5X. JFETs 23, 27, and 28 each have their source and gate electrodes connected to $+V$. The drain electrode of JFET 23 is connected to the source of JFET 22. The drain electrode of JFET 27 is connected to conductor 21. The drain electrode of JFET 28 is connected to the source of JFET 29.

In operation, if the sampling input $V_s$ is at a high level, transistor 4 is on, transistor 5 is off, and $V_{35}$ is pulled by resistor 6 to near $+V$. With $V_{35}$ near $+V$ volts ($+V$ typically being $+4.5$ to $+18$ volts), the source-to-drain voltage of JFET 16 is large enough to cause $I_1$ to be approximately 200 microamperes. This is a sufficiently high current to develop enough voltage across resistor 15 to turn transistor 17 on. Transistor 17 then rapidly charges conductor 21 and the roughly 5 picofarads of capacitance associated with it and the gate electrodes of JFETs 24, 25, and 26 to almost $+V$ volts, turning JFET 26 off. A small current equal to the $I_{DSS}$ of JFET 24 or JFET 25 is supplied by current source JFET 16. This current is not large enough to turn NPN transistor 17 on.

If sampling voltage $V_s$ is at a low level, transistor 4 is off, transistor 5 is on, and the current pulled through resistor 6 by transistor 5 and transistor 7 pulls $V_{35}$ to a sufficiently low voltage that $I_1$ is close to zero microamperes. Transistor 17 then is off and no appreciable current flows into conductor 21. Switching JFET 26 then is turned on.

At this point it should be understood that the novelty of the present invention includes the provision of JFETs 25, 28, and 29. The closest prior art structures, such as those in the above mentioned patents, include circuitry analogous to switching JFET 26, JFET 24, and a buffer which in FIG. 1 includes JFETs 22 and 23. Suppose JFET 25 and the buffer including JFETs 28 and 29 are omitted. Also suppose a large number of such modified analog switch circuits 1 are connected in parallel, with the source electrode of each switching JFET such as 26 being connected to an analog bus which has a 1000 picofarad capacitance, and suppose the voltage $V_{out}$ on the analog bus is significantly higher than the input voltage $V_{in}$ of one of the analog switch JFETs. Then the PN junction between the source electrode and gate electrode of that analog JFET switch would become forward biased.

Input circuit 2 presents a high impedance to conductor 21 when $I_1$ is zero and transistor 17 is off. There is nowhere for the depletion capacitance of the forward biased source-to-gate junction of JFET 26 to be discharged except through the internal channel resistance of switching JFET 26. Since the charge storage capacitance of a junction forward biased as much as 0.6 to 0.65 volts is very large (e.g. as large as 1000 picofarads), it takes a very long time for that charged up charge storage capacitance to be discharged through the internal resistance of switching JFET 26. For example, discharge time may be of the order of 10 to 30 microseconds. This is far longer than the time that otherwise would be required for any voltage difference between $V_{out}$ and $V_{in}$ to be equalized through the channel resistance of switching JFET 26 when it has been rapidly turned on.

The long continuing flow of current through the internal channel resistance of switching JFET 26 as the charge storage capacitance is discharged produces small errors during the decay of the voltage difference between $V_{OUT}$ and $V_{IN}$ from approximately 10 millivolts to approximately 10 microvolts. In typical applications of the type described above, errors of more than about ten microvolts may be unacceptable, so it is necessary to wait for the entire ten to thirty microsecond time for discharge of the charge storage capacitance, which is ten times or more longer than would be needed if the source-to-gate PN function were not forward biased by more than 0.3 to 0.5 volts.

In accordance with the present invention, provision of the buffer 29,28 and JFET 25 prevents the source-gate PN junction from becoming forward biased, thereby eliminating the long, slow discharge thereof that produces the above mentioned switching errors.

The normal turn-on time for switching JFET 26 for $V_{out}$ to settle to within 0.1 percent of $V_{in}$ is less than approximately 1 microsecond, and the time for the source-gate charge storage capacitance, if forward biased by more than 0.6 volts circuit operation, to discharge so that $V_{out}$ is within 0.01 percent or 0.0001 percent of the $V_{in}$ is ten to thirty microseconds.

Thus, the invention provides not only fast turn-off of switching JFET 26, but also provides fast, complete turn-on without errors exceeding roughly ten microvolts for a $V_{out}$ transition of as high as ten volts with a 1000 picofarad load.

As long as conductor 21 is in its high impedance state, with switching JFET 26 on, JFETs 24 and 25 cooperate to prevent the source-gate PN junction of JFET 26 from being forward biased more than approximately 0.2 volts. This prevents the charge storage capacitance from increasing more than a few picofarads. $V_{21}$ therefor is relatively rapidly discharged through the channel resistance of JFET 26, and there is rapid equalization of $V_{out}$ to $V_{in}$ to within about ten microvolts.

As this equalization of $V_{out}$ and $V_{in}$ occurs, JFET 26 goes into its so called "triode" or resistive mode, rather than its current limiting mode. And JFET 25 goes into its triode or resistive mode. Then, if $V_{out}$ exceeds $V_{in}$, JFET 24 is in its current limiting mode. This limits $V_{GS}$ of JFET 25, and hence of JFET 26 to less than 1 diode drop, so extremely large amounts of charge are not stored in the source-gate junction capacitance of JFET 26. Those skilled in the art will know that for a 100X JFET geometry, the gate-to-source PN junction capacitance may have typical values as indicated by the following table:

| $V_{SG}$ | $C_{junction}$ |
|---|---|
| 0 volts | 2 pf |
| 0.2 volts | 4 pf |
| 0.6 volts | 100 pf |
| 0.66 volts | 1,000 pf |

When JFET 25 is in its triode or resistive mode, and $V_{21}$ starts to fall below the voltage of the source of transistor 29, the above described cooperation of JFETs 24 and 25 prevents the source and gate voltage of JFET 26 from being any more than approximately 0.2 volts apart. This means that the source-to-gate PN junction capacitance of JFET 26 can't store enough charge to drastically increase the time required to for $V_{out}$ to precisely equal $V_{in}$.

When JFET 25 goes into its triode region, JFET 24 is in its current limiting region and JFET 25 is in its resistive region. The current through JFET 27 supplies part of the current flowing through JFET 24, the rest being supplied by JFET 25. The current flowing through JFET 25 is selected (by design of JFET 27) to produce a 0.2 volt drop between the source and drain of JFET 25. The gate and source electrodes of JFET 29 are at essentially the same voltage.

The symmetrical configuration of switching circuit 3 provides essentially analogous operation if $V_{in}$ exceeds $V_{out}$, except that JFETs 24 and 25 play opposite roles to prevent conductor 19 from being more than about 0.2 volts more positive than $V_{21}$, thereby preventing the source-to-gate PN junction capacitance of JFET 26 from reaching very high capacitance levels.

Use of JFET 27 is optional, but including it to determine the amount of current through JFET 25 results in the lowest possible forward bias of JFET 24 or JFET 25 in either mode of operation, ie. $V_{out}$ exceeding $V_{in}$ or vice versa.

Figure 2:
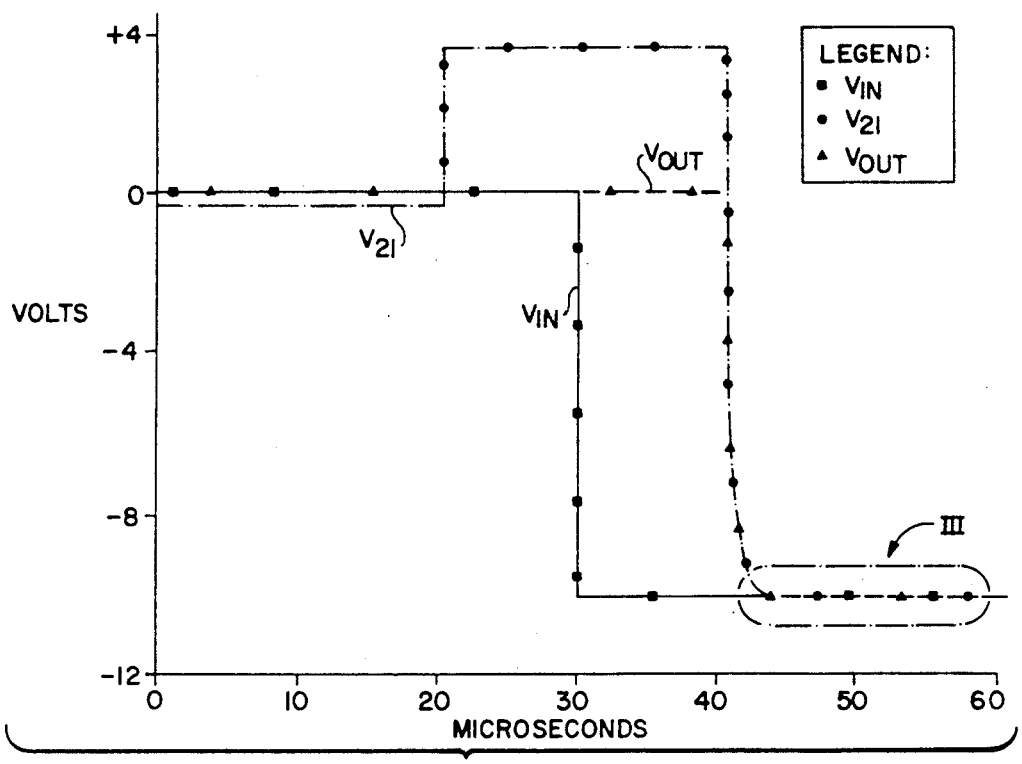
FIG. 2 is a diagram showing waveforms useful in explaining the operation of the circuit of FIG. 1.

The waveforms of FIG. 2 were produced by a computer circuit simulation of the circuit essentially as shown in FIG. 1. The portion of the waveforms prior to the 20 microsecond point occurs when JFET 26 is on. $V_{21}$ is −0.2 volts, a value selected to slightly forward bias the source-gate PN junction in order to minimize the channel resistance of JFET 26, but not enough to greatly increase the charge storage capacitance of that junction. $V_{out}$ and $V_{in}$ initially are precisely equal. At 20 microseconds, $V_{21}$ increases from zero volts to almost +4 volts, as a result of $V_s$ assuming a high positive voltage level. This very rapidly turns JFET 26 off, and between the 20 microsecond and 30 microsecond points there is no change in $V_{in}$ or $V_{out}$. Then, at the 30 microsecond point, $V_{in}$ undergoes a transition from zero volts to −10 volts. However, since $V_{21}$ is still at +4 volts, JFET 26 remains off, and $V_{out}$ is unchanged. At the 40 microsecond point, $V_{21}$ undergoes a transition from +4 volts to zero volts, and continues down to −10 volts. By the time $V_{21}$ reaches zero volts, JFET 26 is turned on. $I_1$ has been reduced to zero microamperes, and conductor 21 is in its high impedance state. Therefor, conductor 21 continues to be discharged to −10 volts through JFET 24. The charge on the 1000 picofarad output capacitance 41 is rapidly discharged through JFET 26, causing $V_{out}$ to be reduced nearly to $V_{in}$.

It can be seen that during turn-on of JFET 26, $V_{out}$ never exceeds $V_{21}$ significantly, and more particularly, $V_{out}$ never exceeds $V_{21}$ by more than about 0.2 volts.

Figure 3:
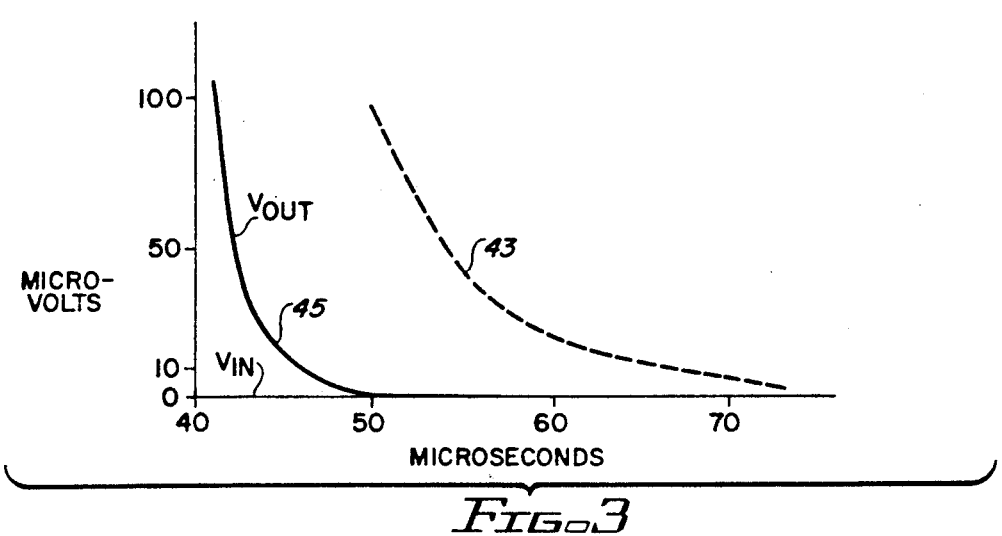
FIG. 3 is a diagram with an expanded vertical scale showing settling of the node voltages shown in FIG. 2.

FIG. 3 shows portion III of FIG. 2 with a greatly expanded voltage axis, showing relatively rapid discharge of $V_{21}$ to its quiescent value and also showing rapid equalization of $V_{out}$ to equal $V_{in}$ within approximately 10 microvolts. In FIG. 3, dotted line 43 indicates approximately how long equalization would take for the prior art circuitry (without JFETs 25, 29, and 28 or equivalent circuitry). It can be seen that 10 to 30 microseconds of low level settling time would be required for $V_{out}$, with a 1000 picofarad load capacitance, to settle to within 10 microvolts of $V_{in}$, instead of approximately five microseconds, as indicated by curve 45 in FIG. 3, for the present invention.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

What is claimed is:

1. A high speed, high current analog switching circuit, comprising in combination:
   (a) a switch JFET having first and second current-carrying electrodes and a gate electrode, the first and second current-carrying electrodes being coupled to an analog input terminal and an analog output terminal, respectively;
   (b) a first JFET having a source electrode, a drain electrode coupled to a first supply voltage conductor, and a gate electrode coupled to the first current-carrying electrode of the switch JFET;
   (c) a second JFET having a first current-carrying electrode coupled to the source electrode of the first JFET, a second current-carrying electrode coupled to the gate electrode of the switch JFET, and a gate electrode coupled to the gate electrode of the switch JFET;
   (d) a third JFET having a source electrode, a drain electrode coupled to the first supply voltage conductor, and a gate electrode coupled to the second current-carrying electrode of the switch JFET; and
   (e) a fourth JFET having a first current-carrying electrode coupled to the source electrode of the third JFET, a second current-carrying electrode coupled to the gate electrode of the switch JFET, and a gate electrode coupled to the gate electrode of the switch JFET,
   wherein both rapid turn-on of the switch JFET and rapid equalization of voltages on the analog input terminal and the analog output terminal to within a predetermined minute voltage difference are achieved.

2. The high speed, high current analog switching circuit of claim 1 wherein the switch JFET is a P-channel JFET, and the first, second, third, and fourth JFETs are P-channel JFETs.

3. The circuit of claim 2 wherein the switch JFET has a relatively large channel width-to-length ratio, the first and third JFETS each have a channel width-to-length ratio substantially smaller than that of the switch JFET, and the second and fourth JFETs each have a channel width-to-length ratio smaller than that of the first and third JFETs.

4. The high speed, high current analog switching circuit of claim 2 including a fifth JFET having a source electrode and a gate electrode coupled to a second supply voltage conductor and a drain electrode coupled to the gate electrode of the switch JFET, for performing the function of reducing a source-to-gate voltage of the switch JFET.

5. The high speed, high current analog switching circuit of claim 4 including a sixth JFET having a source electrode and a gate electrode coupled to the second supply voltage conductor and a drain electrode coupled to the source electrode of the first JFET, and a seventh JFET having a source electrode and a gate electrode coupled to the second supply voltage conductor and a drain electrode coupled to the source electrode of the third JFET.

6. The high speed, high current analog switching circuit of claim 2 including a control circuit having an output coupled to the gate electrode of the switch JFET, the control circuit including:
   (1) a current source responsive to a sample control input signal;
   (2) a transistor having a base electrode coupled to the current source and an emitter electrode coupled to the output of the control circuit;
   (3) a resistor coupled between the base and emitter electrodes of the transistor, the current source producing a sufficiently large current in response to a first level of the sample control input signal to turn the transistor on, the current source producing essentially zero current in response to a second level of the sample control input signal,
   whereby rapid turn-off of the switch JFET is achieved in response to the first level and a high impedance condition of the output of the control circuit is achieved in response to the second level.

7. A high speed, high current analog switching circuit, comprising in combination:
   (a) a switch JFET having first and second current-carrying electrodes and a gate electrode, the first and second current-carrying electrodes being coupled to an analog input terminal and an analog output terminal, respectively;
   (b) a first buffer circuit having an input terminal coupled to the analog input terminal, and an output terminal;
   (c) a first JFET having a first current-carrying electrode coupled to the output terminal of the first buffer circuit, a second current-carrying electrode coupled to the gate electrode of the switch JFET, and a gate electrode coupled to the gate electrode of the switch JFET;
   (d) a second buffer circuit having an input terminal coupled to the analog output terminal, and an output terminal; and
   (e) a second JFET having a first current-carrying electrode coupled to the output terminal of the second buffer circuit, a second current-carrying electrode coupled to the gate electrode of the switch JFET, and a gate electrode coupled to the gate electrode of the switch JFET, wherein both rapid turn-on of the switch JFET and rapid equalization of voltages on the analog input terminal and the analog output terminal to within a predetermined minute voltage difference ar achieved.

8. A method for rapidly equalizing an output voltage produced on an analog output terminal of an analog switch circuit with an input voltage applied to an analog input terminal thereof, the method comprising the steps of:

(a) applying the input voltage to a first current-carrying electrode of a switch JFET and to an input of a first buffer circuit, a second current-carrying electrode of the switch JFET being coupled to the analog output terminal;

(b) applying an output signal produced by the first buffer to a first current-carrying electrode of a first JFET, a second current-carrying electrode of the first JFET being coupled to a gate electrode of the switch JFET;

(c) applying the output voltage to an input of a second buffer circuit and applying an output signal produced by the second buffer circuit to a first current-carrying electrode of a second JFET, a second current-carrying electrode of the second JFET being coupled to the gate electrode of the switch JFET;

(d) applying a turn-on signal to gate electrodes of the switch JFET and the first and second JFETs, wherein the first JFET operates in its current saturation mode, the second JFET operates in its resistive mode, and the switch JFET operates in its resistive mode to prevent overcharging a charge storage capacitance of a source-gate PN junction of the switch JFET and consequently preventing slow discharge of the capacitance through the channel resistance of the switch JFET.

9. The method of claim 8 wherein step (d) includes presenting a very high impedance to the gate electrodes of the switch JFET and the first and second JFETs.

10. The method of claim 8 including preventing forward biasing the source-gate PN junction enough that equalization of the voltages of the input and output terminals through the channel resistance to within approximately 10 microvolts requires no more than approximately 5 microseconds.

11. The method of claim 10 including preventing forward biasing of the source-gate PN junction by more than approximately 0.2 volts.

12. An analog switch circuit including circuitry for rapidly equalizing an output voltage produced on an analog output terminal of the analog switch circuit with an input voltage applied to an analog input terminal thereof, the analog switch circuit comprising in combination:

(a) a switch JFET, a first JFET, and a second JFET each having first and second current-carrying electrodes and a gate electrode;

(b) first and second buffer circuits each having an input and an output;

(c) means for applying the input voltage to the first current-carrying electrode of the switch JFET and to the input of the first buffer circuit, the second current-carrying electrode of the switch JFET being coupled to the analog output terminal;

(d) means for applying an output signal produced on the output of the first buffer to the first current-carrying electrode of the first JFET, the second current-carrying electrode of the first JFET being coupled to the gate electrode of the switch JFET;

(e) means for applying the output voltage to the input of the second buffer circuit and applying an output signal produced on the output of the second buffer circuit to the first current-carrying electrode of the second JFET, the second current-carrying electrode of the second JFET being coupled to the gate electrode of the switch JFET;

(f) means for applying a turn-on signal to the gate electrodes of the switch JFET and the first and second JFETs, wherein the first JFET operates in a current saturation mode, the second JFET operates in a resistive mode, and the switch JFET operates in a resistive mode to prevent overcharging a charge storage capacitance of a source-gate PN junction of the switch JFET, preventing slow discharge of the capacitance through a channel resistance of the switch JFET.

13. The analog switch circuit of claim 12 including means for presenting a high impedance to the gate electrodes of the switch JFET and the first and second JFETs while maintaining them in a turned on condition.

14. The analog switch circuit of claim 12 including means for preventing forward biasing of the source-gate PN junction enough that equalization of the voltages of the input and output terminals through the channel resistance to within approximately 10 microvolts requires no more than approximately 5 microseconds.

15. The analog switch circuit of claim 14 including means for preventing forward biasing of the source-gate PN junction by more than approximately 0.2 volts.

* * * * *